(12) United States Patent
Mantl et al.

(10) Patent No.: US 8,048,220 B2
(45) Date of Patent: Nov. 1, 2011

(54) METHOD FOR PRODUCING A STRAINED LAYER ON A SUBSTRATE AND LAYERED STRUCTURE

(75) Inventors: Siegfried Mantl, Jülich (DE); Bernhard Holländer, Jülich (DE); Dan Mihai Buca, Jülich (DE)

(73) Assignee: Forschungszentrum Julich GmbH, Julich (DE)

( * ) Notice: Subject to any disclaimer, the term of this patent is extended or adjusted under 35 U.S.C. 154(b) by 1140 days.

(21) Appl. No.: 11/664,535

(22) PCT Filed: Sep. 22, 2005

(86) PCT No.: PCT/DE2005/001669
§ 371 (c)(1),
(2), (4) Date: Mar. 30, 2007

(87) PCT Pub. No.: WO2006/034679
PCT Pub. Date: Apr. 6, 2006

(65) Prior Publication Data
US 2008/0067544 A1 Mar. 20, 2008

(30) Foreign Application Priority Data
Sep. 30, 2004 (DE) .................. 10 2004 048 096

(51) Int. Cl.
*C30B 1/02* (2006.01)
(52) U.S. Cl. ................ 117/2; 117/5; 117/8; 117/9
(58) Field of Classification Search .............. None
See application file for complete search history.

(56) References Cited

U.S. PATENT DOCUMENTS

| | | | | |
|---|---|---|---|---|
| 5,244,970 A | * | 9/1993 | Kobayashi et al. | 525/63 |
| 5,698,869 A | * | 12/1997 | Yoshimi et al. | 257/192 |
| 5,847,419 A | * | 12/1998 | Imai et al. | 257/192 |
| 5,886,385 A | * | 3/1999 | Arisumi et al. | 257/347 |
| 6,455,894 B1 | * | 9/2002 | Matsumoto et al. | 257/347 |
| 6,464,780 B1 | | 10/2002 | Mantl et al. | |
| 6,573,126 B2 | * | 6/2003 | Cheng et al. | 438/149 |
| 6,699,764 B1 | * | 3/2004 | Tweet et al. | 438/305 |
| 6,703,293 B2 | * | 3/2004 | Tweet et al. | 438/518 |
| 6,765,227 B1 | * | 7/2004 | Yu et al. | 257/19 |
| 6,787,852 B1 | * | 9/2004 | Yu et al. | 257/347 |
| 6,876,010 B1 | * | 4/2005 | Fitzgerald | 257/191 |
| 6,900,094 B2 | * | 5/2005 | Hammond et al. | 438/238 |
| 7,064,387 B2 | * | 6/2006 | Jang | 257/347 |

(Continued)

FOREIGN PATENT DOCUMENTS

WO    WO 2004/081982 A2    9/2004

(Continued)

OTHER PUBLICATIONS

Peters, R.L. et al; Crystal-direction dependence of uniaxial tensil strain in ultra-thin SOI; IEEE International SOI Conference; Oct. 2004; pp. 39-41.

(Continued)

*Primary Examiner* — Bob M Kunemund
(74) *Attorney, Agent, or Firm* — Jonathan Myers; Andrew Wilford

(57) ABSTRACT

The invention relates to a method for producing a strained layer. Said method comprises the following steps: placing the layer on a substrate and straining it, structuring the strained layer, relaxing the layer, producing directional off-sets in the layer to be strained. A layered structure produced in this manner has triaxially strained layers.

17 Claims, 5 Drawing Sheets

U.S. PATENT DOCUMENTS

Figure 1:
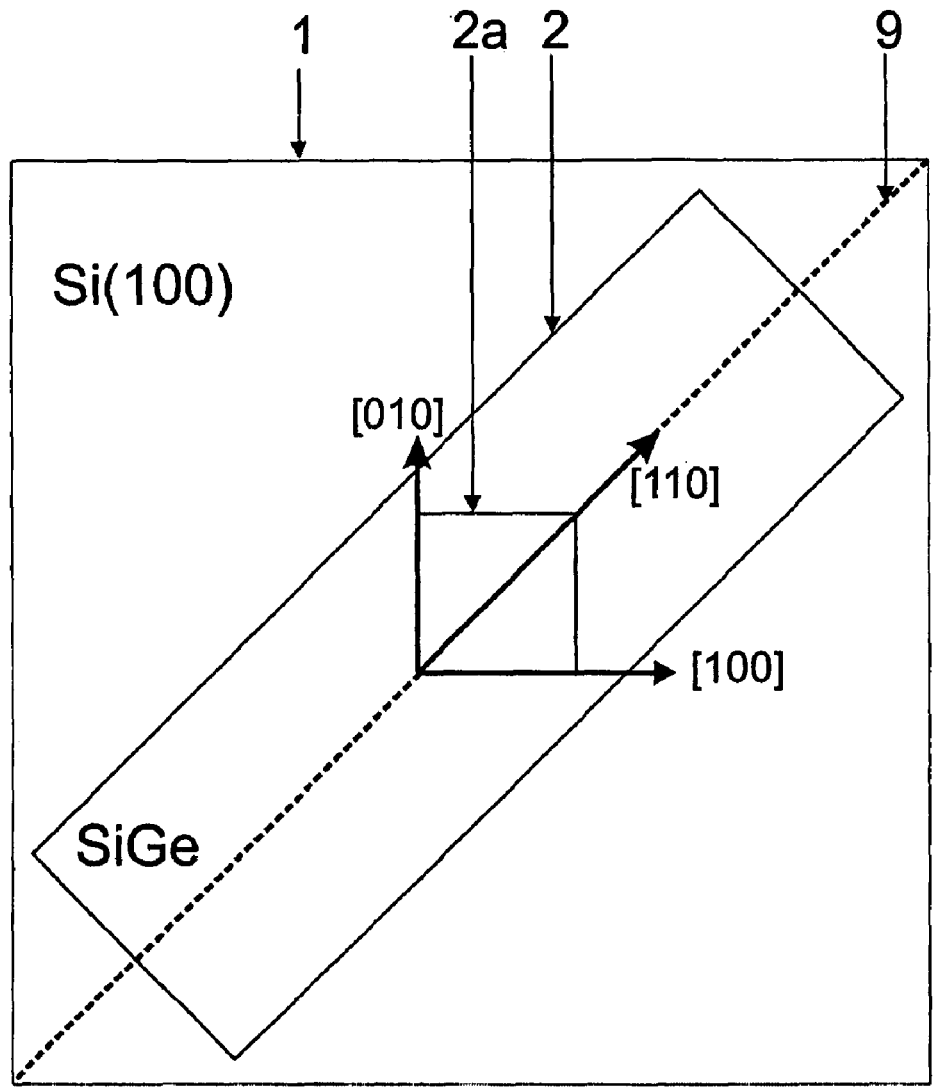

| | | | |
|---|---|---|---|
| 7,078,771 B2 * | 7/2006 | Kim | 257/351 |
| 7,084,075 B2 * | 8/2006 | Kluth et al. | 438/770 |
| 7,256,463 B2 * | 8/2007 | Matsumoto et al. | 257/392 |
| 7,416,965 B2 * | 8/2008 | Mantl et al. | 438/479 |
| 7,615,471 B2 * | 11/2009 | Mantl | 438/479 |
| 2002/0005561 A1 * | 1/2002 | Kobayashi et al. | 257/510 |
| 2002/0055661 A1 * | 5/2002 | Kiihling et al. | 568/724 |
| 2002/0185686 A1 | 12/2002 | Christiansen et al. | |
| 2004/0178406 A1 | 9/2004 | Chu | |
| 2006/0211221 A1 * | 9/2006 | Mantl et al. | 438/475 |
| 2006/0220127 A1 * | 10/2006 | Mantl | 257/347 |

FOREIGN PATENT DOCUMENTS

| | | |
|---|---|---|
| WO | WO 2004/081982 A3 | 9/2004 |

OTHER PUBLICATIONS

Aguilar, M.Enciso et al; Strained Si HFETs for microwave applications: state-of-the-art and further approaches; Solid-State Electronics (www.sciencedirect.com); #48 (2004) pp. 1443-1452.

Buca, D., et al; Tensely strained silicon on SiGe produced by strain transfer; Applied Physics Letters; vol. 85, No. 13; Sep. 2004; pp. 2499-2501.

* cited by examiner

METHOD FOR PRODUCING A STRAINED LAYER ON A SUBSTRATE AND LAYERED STRUCTURE

CROSS REFERENCE TO RELATED APPLICATIONS

This application is the US national phase of PCT application PCT/DE2005/001669, filed 22 Sep. 2005, published 6 Apr. 2006 as WO 2006/034679, and claiming the priority of German patent application 102004048096.6 itself filed 30 Sep. 2004.

The invention relates to a method for producing a strained layer on a substrate, and a layered structure.

The production of monocrystalline films is often limited greatly by the available substrate material and the quality of the films. Differing crystal structures as well as differing lattice parameters of the substrate and the layer material (lattice mismatch) generally prevent crystalline growth of high-quality layers. Silicon-germanium (Si—Ge) alloys on silicon (Si) represent a particularly important example for microelectronic applications. When monocrystalline layers are deposited with mismatched lattice parameters, the layers are initially grown under mechanical strain; i.e. their lattice structure in this state differs from their inherent structure. If the deposited layer exceeds a specific degree of strain, the mechanical tension is reduced by formation of dislocations, and the lattice structure more closely approaches the inherent structure. This process is called stress relaxation, hereinafter referred to as relaxation.

For layer thicknesses frequently required for components, this relaxation is used to incorporate dislocations at the interface between the formed layer and the substrate. However, it is disadvantageous that numerous dislocations, referred to as threading dislocations, extend from the interface to the layer surface. Since most of these dislocations continue further through the newly grown layers, they greatly impair the electrical and optical characteristics of the layer material. Threading dislocations are therefore a significant problem in the production of layers.

When a certain level of lattice mismatch is reached (approximately >0.5%), the threading dislocation density becomes so high that such layers are unsuitable for components. The threading dislocation density can generally be reduced somewhat by heat treatment.

The lattice mismatch dislocations at the interface between the layer and the substrate are also referred to as misfit dislocations. Misfit dislocations are necessary for strain relaxation, but they do not degrade the layer(s) above them.

Since the silicon-germanium (Si—Ge) material system is a completely miscible system thermodynamically, the compound may be prepared in any given concentration. Although silicon and germanium are characterized by identical crystal structures, their lattice parameters differ by 4.2%; i.e. a Si—Ge layer or a pure Ge layer on silicon grows under strain. Carbon may be incorporated, into silicon up to approximately 2 atom-% substitution to reduce the lattice parameter.

Modern telecommunications require fast and economical transistors. Previous transistors based on silicon do not exhibit the desired speeds. Use of high-quality, relaxed Si—Ge layers allows faster transistors to be developed that for the most part are compatible with silicon technology.

According to the prior art, for the production of strained silicon a Si—Ge buffer layer having a germanium content typically in the range of 15 to 30 atom-% is used upon which pure silicon epitaxially grows. As a result of the epitaxial growth the growing Si layer assumes the crystal lattice of the buffer layer. Because the interatomic distance in the Si—Ge buffer layer is greater than in a silicon monocrystal, the lattice of the growing silicon layer expands, thereby changing its electronic characteristics for the better since electrons are able to flow more quickly through the transistor. The possible switching frequency increases and the power consumption of the transistor decreases.

The layered growth of these layers, also referred to as graded layers, is known from E. A. Fitzgerald et al ("Thin Solid Films," 294 (1997) 3-10). The Si layer intended for inducing strain is epitaxially deposited on a Si—Ge graded layer, and the Si—Ge layer relaxes. The Ge concentration increases continuously or in a stepwise manner until a desired Ge content is attained. Since for maintaining the layer quality the Ge content can increase only by approximately 10 atom-% per μm used, such layers have thicknesses of up to 10 micrometers, depending on the Ge concentration achieved. The substrate produces tensile stresses on the Si—Ge layer in the growth plane in the <100> and <010> directions. This state is referred to as biaxial strain. The Si—Ge assumes an orthorhombic lattice structure as the result of lattice distortions. In the growth plane the lattice parameters a and b are equal, whereas the lattice parameter c in the <001> direction is different from a. The lattice distortion of the Si results in an energetic shift of the energy bands and holes so that there is an energy difference between light and heavy charge carriers, resulting in significantly increased electron mobility.

It is known from Rim et al (K. Rim, K. Chan, L. Shi, D. Boyd, J. Ott, N. Klymko, F. Cardone, L. Tai, S. Koester, M. Cobb, D., Canaperi, B. To, E. Duch, I. Babich, R. Carruthers, P. Saunders, G. Walker, Y. Zhang, M. Steen, and M. Ieong, "Fabrication and mobility characteristics of ultra-thin strained Si directly on insulator (SSDOI) MOSFETs," 2003 IEEE IEDM, p. 3.1.1) that the Si layer produced in this manner has improved hole mobility only at Ge concentrations greater than 30 atom-% in the Si—Ge layer.

It is disadvantageous that the increase in hole mobility is no longer appreciable under high electrical fields that are common in the operation of MOSFETs. In addition, the production of such highly strained layers is problematic with regard to the thermal stability of the structure.

It is known from Ghani et al (T. Ghani, M. Armstrong, C. Auth, M. Bost, P. Charvat, G. Glass, T. Hoffman, K. Johnson, C. Kenyon, J. Klaus, B. McIntyre, K. Mistry, A. Murthy, J. Sandford, M. Silberstein, S. Sivakumar, P. Smith, K. Zawadzki, S. Thompson, and M. Bohr, "A 90 nm high volume manufacturing technology featuring novel 45 nm gate length strained silicon CMOS transistors," 2003 IEEE IEDM, p.) to increase the hole mobility by filling the source and drain regions of transistors with Si—Ge and applying uniaxial pressure on the silicon channel region therebetween. In contrast to biaxial strain, under uniaxial strain the lattice is deformed in only one direction. Increased hole mobility is achieved when the uniaxial pressure and the flow in the transistor are in the <110> direction. It is disadvantageous that this method cannot be used for n-channel MOSFETs because of the resulting reduction in electron mobility.

It is known from Mistry et al (K. Mistry, M. Armstrong, C. Auth, S. Cea, T. Coan, T. Ghani, T. Hoffmann, A. Murthy, J. Sandford, R. Shaheed, K. Zawadzki, K. Zhang, S. Thompson, and M. Bohr, Delaying Forever: Uniaxial strained silicon transistors in a 90 nm CMOS technology, 2004 IEEE Symposium on VLSI Technology, p. 50) to apply an additional layer of silicon nitride, for example, to a transistor structure. The layer exerts a tension in the <110> direction and a pressure in the <010> direction, thereby slightly increasing the electron mobility. The output current of n-MOSFETs has been increased by approximately 10% by use of this method.

A disadvantage in the two latter referenced methods is that only a relatively limited improvement in the transistor characteristics is achieved. The degree of strain, i.e. the increase in mobility, still depends on the dimensions of the transistors. It is also disadvantageous that for the two methods completely different processing steps are carried out in the production of n- and p-channel components.

Known from Yang et al (M. Yang, M. Ieong, L. Shi, K. Chan, V. Chan, A. Chou, E. Gusev, K. Jenkins, D. Boyd, Y. Ninomiya, D. Pendleton, Y. Surpris, D. Heenan, J. Ott, K. Guarini, C. D'Emic, M. Cobb, P. Mooney, B. To, N. Rovedo, J. Benedict, R. Mo, and H. Ng, High performance CMOS fabricated on hybrid substrate with different crystal orientations, 2003 IEEE IEDM, p. 18.7.1) is a bonding method for producing layers having improved electronic characteristics. Different crystallographic directions are used on the Si surface (100 for electrons and 110 for holes). The 110 surface of the Si is characterized by an approximately 100% increase in hole mobility, but a lower electron mobility compared to 100 Si. Therefore, 100 Si or even biaxially strained Si must be used for n-channel components.

A disadvantage of this method is that wafers having different crystallographic directions must be bonded together, and selective silicon epitaxy is then necessary in the prestructured openings. This makes the method complicated and, in particular with regard to formation of defects in the structure, difficult to control.

A method is known from WO 1999/038201 [U.S. Pat. No. 6,464,780] for the production of thin strain-relaxed Si—Ge buffer layers by ion implantation and heat treatment. A disadvantage of this method is that it can be used in turn to produce only strain-relaxed Si—Ge layers with biaxial strain. The silicon layers deposited on these strain-relaxed Si—Ge layers are described as tetragonal with regard to the crystal system. The silicon layer has increased electron mobility compared to a silicon monocrystal.

Thus, all of the referenced methods have the disadvantage that only the electron mobility or only the hole mobility is incrementally improved.

The object of the present invention is to provide a further method for producing strained layers where electron and hole mobility may be increased.

The object is achieved by a method according to the main claim. The object of the invention is also achieved by a layered structure according to the dependent claims. Advantageous embodiments result from the claims that respectively reference the main and/or independent claim.

According to the invention, the method for producing a strained layer with respect to the growth plane is carried out according to the following steps:

The layer to be strained is placed on a substrate and is strained by means of lattice mismatch. The layer is structured by masking, for example, and is relaxed. Use is made of the surface area of the structure to provide directional dislocations in the layer to be strained.

The layer is thus triaxially strained in a particularly advantageous manner. Thus, tensile stresses simultaneously act in the <001>, <010>, and <110> directions on a (100)-oriented substrate. The tensile stresses in the <001> and <010> directions produce a biaxial strain that depends on the amount of lattice mismatch and the degree of relaxation. This biaxial tensile strain in particular shifts the energy bands in the electronic band structure of the Si, thereby increasing the electron mobility. Simultaneous uniaxial tension in the <110> direction is essential for increasing the hole mobility.

Within the scope of the invention it is possible, of course, to use other substrate orientations (the <110> orientation, for example) or crystal structures, since here the glide directions of the dislocations in the layer are likewise provided for orienting the structure.

According to the invention, first a crystallographically oriented structure is formed on the substrate in the layer to be strained. The structure has a surface extension on the substrate. The average extension of the surface area on the substrate, starting from the midpoint of the structure, is different in the various directions of the growth plane. The structure is preferably oriented parallel to the glide direction of the misfit dislocations. For (100) Si this corresponds to the <110> directions in the growth plane. The transistors are usually oriented so that the current then likewise flows in a <110> direction.

The misfit dislocations are then formed in the structure of this layer, making use of the surface area of the structure and the orientation on the substrate. According to the invention, targeted dislocations are formed based on the knowledge of the structure and its surface area extension and configuration on the substrate.

The dislocations are advantageously delimited by the surface area of the structure that is formed. The dislocations are dependent on the lattice parameters of the substrate and the layer provided thereon, as well as the surface area and the orientation of the structure that is formed.

To form the dislocations, crystal defects, i.e. atomic and/or extended defect sites such as clusters, bubbles, cavities, or a thin high-carbon layer are incorporated into, for example, a Si—Ge layer. For this purpose ion implementation, for example with He, H, F, or Si ions, may be performed under suitable conditions.

Starting from the defects, the dislocations are formed by heat treatment or oxidation, for example. This results in relaxation of the layer.

The dislocations are directionally formed in the relaxed layer in a particularly advantageous manner with the knowledge and utilization of the surface extension of the structure on the substrate. The dislocations in the various directions are thus provided with different densities as a function of the geometry and the surface extension of the structure on the substrate, as well as the crystal orientation of the substrate.

The density of the dislocations in the two directions, at least for structures that are smaller than the average glide length of the dislocations, advantageously depends only on the length-to-width ratio of the structure, provided that the directions of propagation of the dislocations are statistically distributed on the two <110> directions in the growth plane. The number of dislocations running in the longitudinal direction (<110>) is therefore greater than in the transverse direction. The density of the misfit dislocations in the Si—Ge layer is a direct measure of the relaxation of strain in the layer. An asymmetric dislocation network means that the Si—Ge layer is asymmetrically relaxed.

It is particularly advantageous for the Si—Ge layer to be structured before the relaxation. As a result, the dislocations may easily and advantageously reach the edge of the structure, so that the mutual blocking of dislocations and the formation of interfering threading dislocations or dislocation entanglements are largely avoided.

A (100) Si wafer or a silicon-on-insulator (SOI) wafer in particular may be used as the substrate.

The lines or the structure are oriented on a (100) Si substrate, preferably in the <110> direction thereof. It is particularly advantageous to form the dislocations parallel to the direction of the structure, thereby achieving optimal hole mobility in the <110> direction. This is particularly advantageous for the formation of p-channel MOSFETs.

It is very advantageous for the structure that is formed to have an average length-to-width ratio in the layer that is slightly greater than two. The length-to-width ratio advantageously influences the asymmetry of the strain, i.e. the magnitude of the tension component in the <110> direction.

The structure has a rectangular design only by way of example. The structure may also have other designs, such as elliptical or other types. This may be advantageously implemented by the use of suitable masks.

As the result of subsequent defect formation and formation of dislocations by relaxing the layer, the dislocations in the longitudinal direction of the structure are advantageously more densely packed than in the transverse direction. In electronic or optical components this increases the charge carrier mobility in the longitudinal direction. At the same time, the longitudinal direction of the structure then also represents the direction in which, for example, the source and drain region, in particular of a p-channel transistor, are oriented at a later time.

Compatibility with the CMOS technology is advantageously provided by a combination of a silicon or SOI substrate and a Si—Ge layer provided thereon.

In a further, very particularly advantageous embodiment of the invention, an additional layer such as a Si layer is triaxially strained and epitaxially provided on a layer produced in this manner, such as a produced Si—Ge layer. It is very particularly advantageous for the additional growing layer to have the same degree of dislocation and the same lattice parameters as the layer located below it.

It is thus possible in a particularly advantageous manner to provide, for example, triaxially strained silicon as an additional layer on a triaxially relaxed Si—Ge layer, for example. In this case the additional Si layer has the same lattice parameters as the relaxed Si—Ge layer located below it. The rate of dislocation of the two layers is complementary.

In a further embodiment of the invention, triaxially strained silicon as well as biaxially (tetragonally) strained silicon may be provided by the choice of the geometric shape of the structure that is formed. Thus, in the structure, triaxially as well as tetragonally strained silicon are provided next to one another in the layered structure in a particularly advantageous manner. The method is therefore very advantageously suited for providing, with respect to the crystal form, both monoclinically and triclinically asymmetrically strained layers next to tetragonally strained layers.

In the case of Si—Ge and Si as layer materials, a monoclinic or triclinic structure is formed from the cubic Si or Si—Ge atomic system, respectively.

When the lithographically produced rectangular structures or lines of the Si—Ge layer to be strained are oriented parallel to a <110> direction of the substrate, monoclinic Si—Ge is obtained. When the orientation is different from the <110> direction, the lattice structure formed is triclinic.

In a further particularly advantageous embodiment of the invention, the structure in the layer to be strained is oriented in the <110> direction of the substrate.

A monoclinic structure of the layer to be strained is characterized in that the lattice parameters a, b in the growth plane are equal, and the c axis differs from a and b. The angle between the b and c axes and between the a and c axes is 90° in each case, whereas the angle between the a and b axes is different from 90°.

The method is therefore suitable for setting the exact lattice parameters by the selection of the length-to-width ratio, or in general, by the geometry and orientation of the structure, such as a rectangle/line on the substrate.

The asymmetric strain may also be influenced by the process parameters, for example by tempering as a heat treatment method.

By way of example only it is noted that an intermediate tempering before lithographic structuring of the Si—Ge layer improves the degree of asymmetry, since this enables the formation of homogeneously distributed nuclei for the dislocations in the Si substrate, and He as the ion used does not escape. In this manner the number of degrees of freedom in carrying out the method is advantageously increased.

For a monoclinic structure, when an additional Si layer is provided on a triaxially relaxed Si—Ge layer, for example, it is advantageous for the structure of the silicon on the Si—Ge to be similar to that of uniaxially strained Si. This is advantageously characterized by greatly increased hole mobility.

Thus, according to the invention the strictly uniaxially strained Si in <110> differs in that the strain state is composed of a biaxial tensile strain in the a and b directions (<100>, <010> directions) and a uniaxial strain in the <110> direction. The biaxial lattice strain causes the energy bands of the silicon to split, resulting in increased electron mobility. In contrast, the uniaxial tension component in the <110> direction produces increased hole mobility.

It is very particularly advantageous that the layer thus has increased hole and electron mobility.

In a further embodiment of the invention, the strain is achieved by optimizing the degree of relaxation by adjusting the implantation and tempering conditions, the layer thicknesses, and the geometric structure of the structured surface, in particular using Si—Ge layers having higher Ge content with the greatest possible layer thicknesses. It is thus advantageously possible to increase the degree of strain.

A further significant advantage of the method is that the strain is constant along the structures.

It is thus advantageously possible to also produce large structures such as lines, with lengths, for example, of several micrometers to several millimeters long, having maximum strain that at the same time is homogeneous. These structures are particularly suited for forming high-quality novel and in particular fast components such as transistors.

This is advantageous for the manufacture of transistors, in that the strain and thus the higher mobility of the charge carriers no longer depends on the dimensions of the components, such as the channel length, for example.

To produce a further increase in electron mobility in addition to increased hole mobility on the same wafer, as an alternative tetragonally strained material of the same material, silicon, for example, may also be produced in the same axial plane. This is achieved by producing square or circular structures, or also very large structures of any given shape, in which asymmetric relaxation no longer occurs due to the limited path length of misfit dislocations. The setting of the ratio of biaxial to uniaxial strain, or, simply put, the asymmetry of the strain, may be specified by a suitable choice of the length-to-width ratio.

The maximum strain may also be specified by the Ge content and the degree of relaxation.

It is particularly advantageous, especially in the case of a Si layer as the layer to be strained, to suitably select the layer thickness $d_3$ thereof so that increased charge carrier mobility is produced in the layer.

Additionally or alternatively, it is also possible to select the implantation and/or tempering conditions during the process so that the charge carrier mobility in the layer is increased.

A Si or silicon-on-insulator (SOI) wafer is generally selected as the substrate.

The invention is described in greater detail below, with reference to illustrated embodiments and the accompanying figures.

FIG. 1 shows in a top view the configuration of a Si—Ge layer 2 on a <100>-oriented Si substrate 1.

The production of a monoclinically/triaxially strained Si—Ge layer 2 by the method according to the invention is described for a first illustrated embodiment.

A 180-nm thick pseudomorphous $Si_{0.79}Ge_{0.21}$ layer 2 was deposited by chemical vapor deposition (CVD) or molecular beam epitaxy (MBE) on a (100) Si substrate 1. The heterostructure was implanted with 45 kev $He^+$ ions at a dosage of $7\times10^{15}$ $cm^{-2}$ or with 195 keV Si ions at a dosage of $1.5\times10^{14}$ $cm^{-2}$. The layer was subsequently tempered at 450° C. for 1 min. The rectangular structure shown in FIG. 5, having a width of 4 μm and a length of 8 millimeters, was structured using lithography, chrome masking, and reactive ion etching. This procedure may also be used to produce a structure, for example, having a 4×8 μm width and length, respectively. The structure was subsequently tempered at 850° C. for 10 min in an Ar atmosphere.

Because of the complete miscibility of Si and Ge, in principle the Ge concentration in the Si—Ge layer 2 may be selected as desired. Ge concentrations in the range of 10 to 30 atom-% are preferred.

The structure 2 is oriented along line 9 in the <110> direction of the substrate. As a result of this configuration of the structure of the Si—Ge layer 2 on the 100 Si substrate, the misfit dislocations form parallel or transverse to the structure, thereby achieving optimal asymmetry of relaxation.

The defect region may alternatively be produced using H ions in the Si—Ge layer 2.

Intermediate tempering is carried out in particular after implantation with He or H ions or other non-removable elements in the substrate. The temperature range for the intermediate tempering is selected so that the heat treatment results in nucleation of He, or H bubbles. This prevents the escape of ions as the result of structuring.

Reference numeral 2a denotes the lattice cell.

Figure 2:
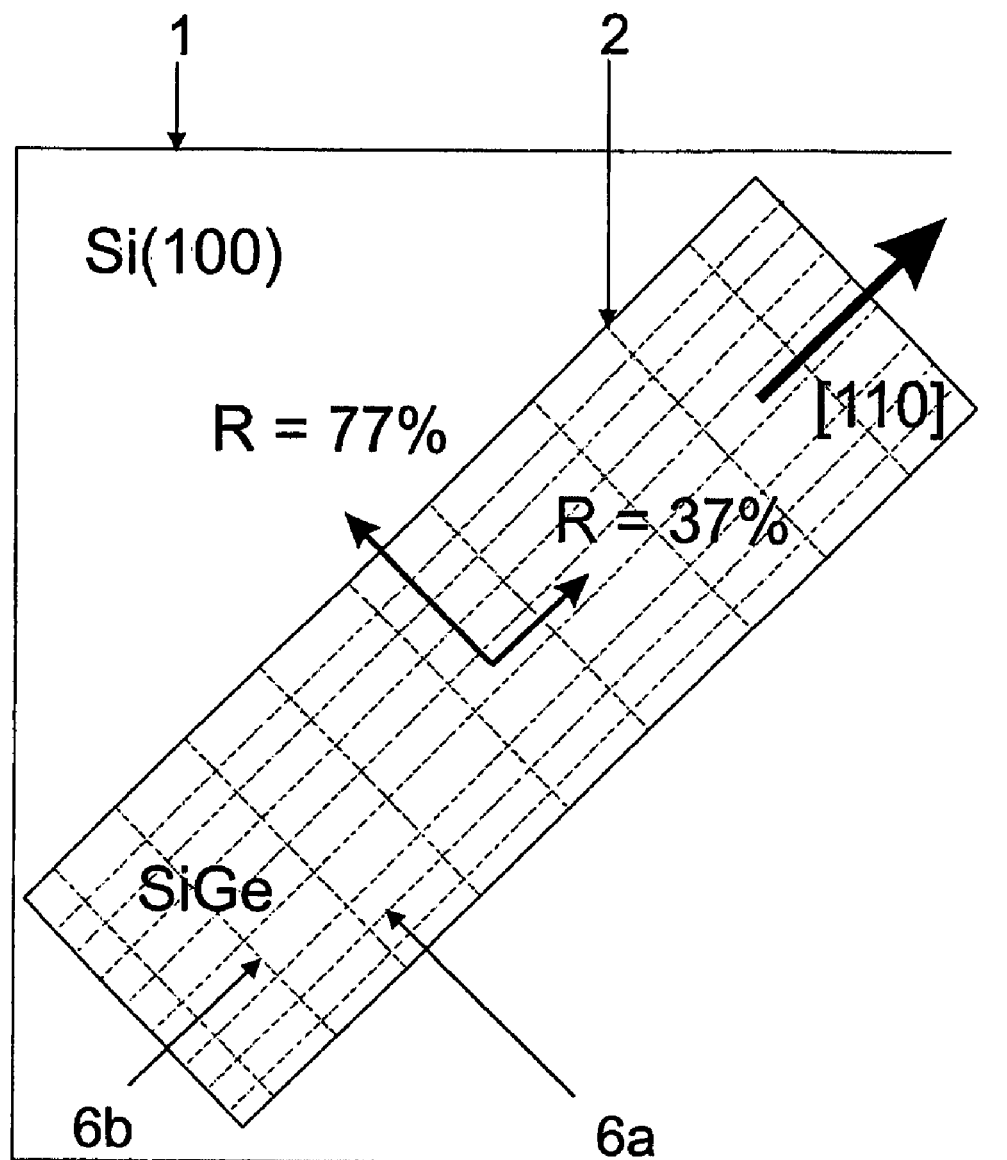

FIG. 2 shows the dislocations 6a and 6b produced in the structure of the Si—Ge layer 2 according to FIG. 1.

The dislocations 6a running in the <110> longitudinal direction of the structure of the Si—Ge layer 2 are tightly packed. Dislocations 6b in the transverse direction are provided with less tight packing. Because of space limitations, only one dislocation is provided with reference numerals.

Rutherford back-scattering/channeling measurements showed that the Si—Ge layer 2 had a relaxation of 37% in the longitudinal direction, but transverse to the rectangular structure had a relaxation of 77%. This means that the lattice parameter in the longitudinal direction is smaller than the lattice parameter in the transverse direction. The hole mobility increased in the longitudinal direction <110>.

Conversion of these degrees of relaxation at 21 atom-% Ge in the Si—Ge layer 2 to relative lattice distortions of the Si resulted in a distortion of approximately 0.35% for one direction and approximately 0.7% for the other direction. This corresponds to a tension of approximately 400 MPa.

Figure 3:
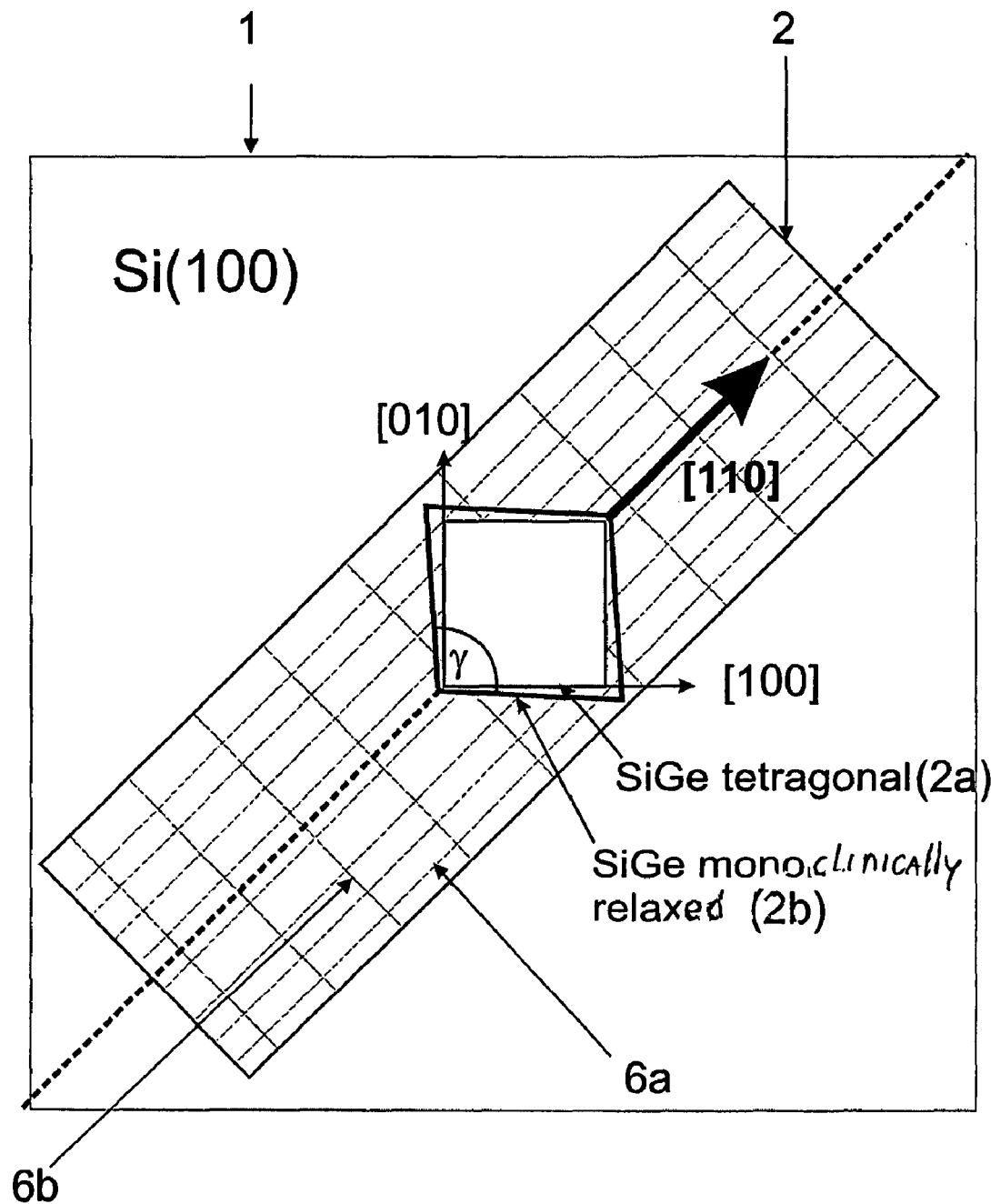

FIG. 3 shows the triaxial strain formed in the Si—Ge layer 2, with reference to lattice cell 2a in a top view.

The triaxial strain of the Si—Ge layer 2 is illustrated by distortion of lattice cell 2a. Whereas tetragonally strained Si—Ge 2 has biaxial tensile strain in the <100> and <010> directions, the triaxially strained Si—Ge 2 according to the invention is also strained by tension in the <−110> direction (see FIG. 4), thereby producing a rhomboidal base surface for lattice cell 2a. This dislocation results in increased hole mobility.

Figure 4:
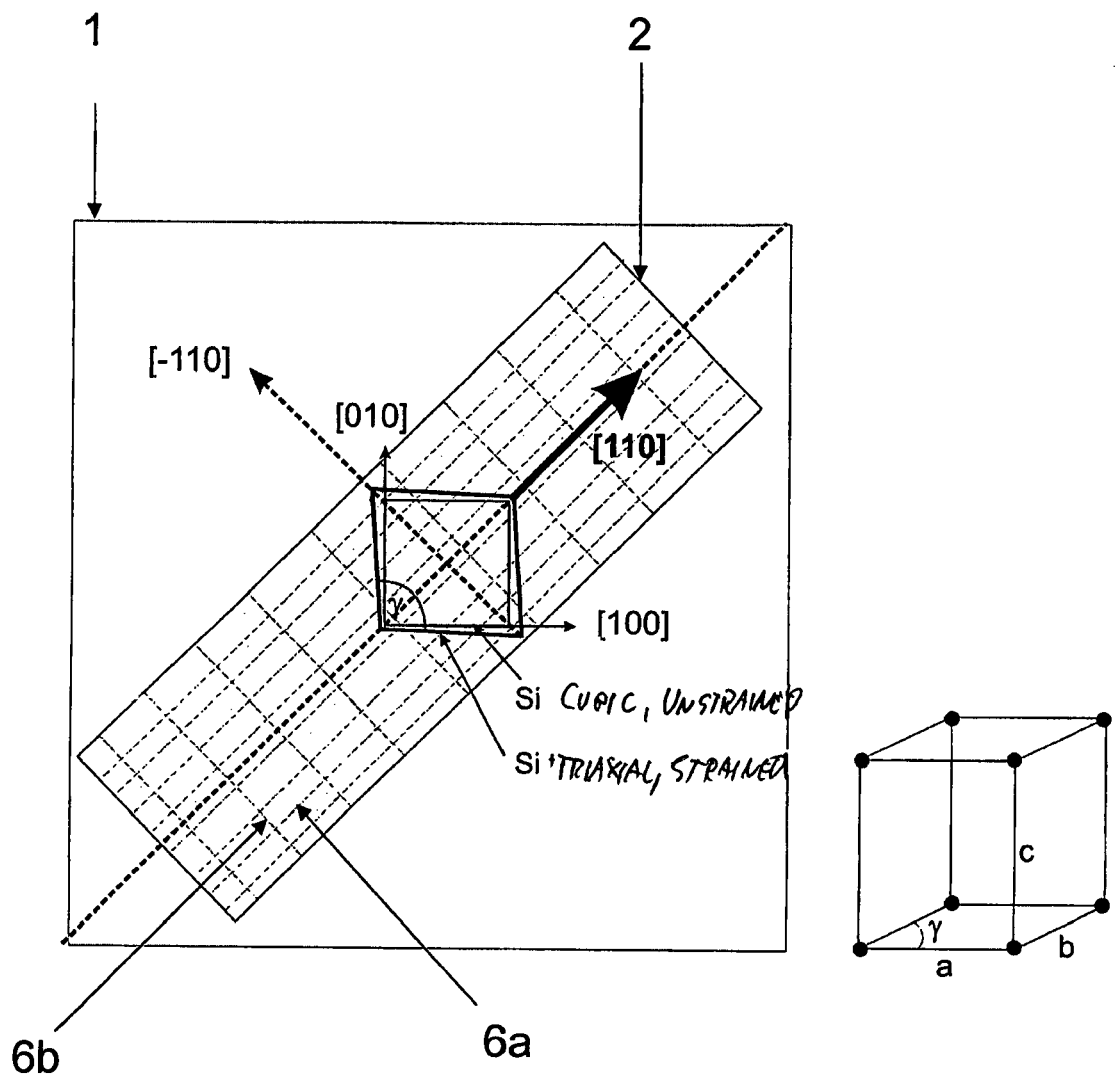

FIG. 4 shows a lattice cell 2a with a resulting monoclinical crystal form. The base surface is rhomboidal, and the angle γ is different from 90°. The large boldface arrow indicates the flow direction in the subsequent transistor. A transistor having increased charge carrier mobility for electrons and holes may be produced therefrom.

Figure 5:
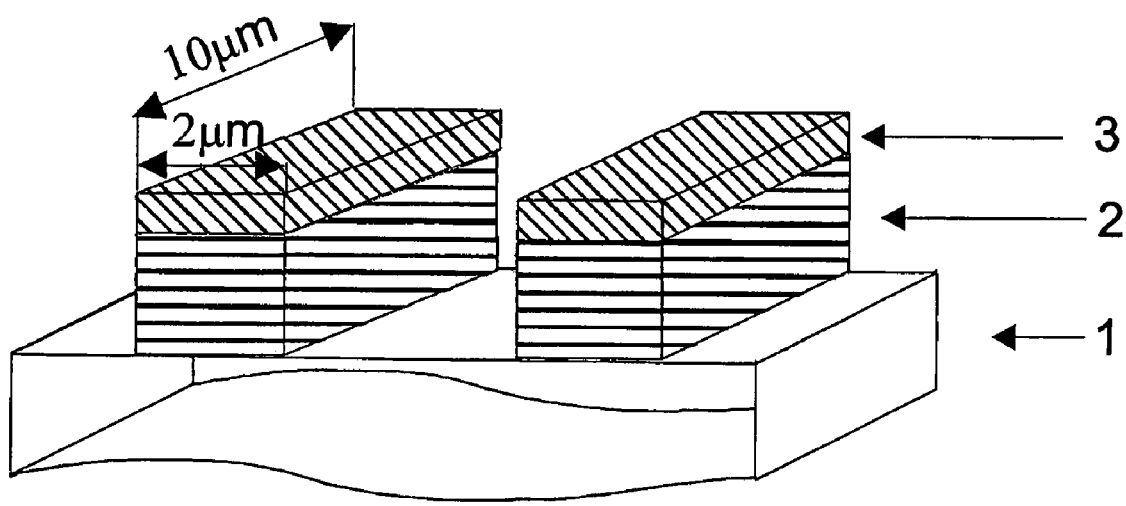

FIG. 5 shows a cross section of the layered structure produced according to the invention, having such a charge carrier mobility after growth of an additional layer 3 on the triaxially strained layer 2. As illustrated in FIGS. 1 through 4, the triaxially strained layer 2 may be composed of Si—Ge, and the substrate 1, of silicon. An additional silicon layer 3 has been epitaxially deposited on the triaxially relaxed Si—Ge layer 2.

In a particularly advantageously manner the additional silicon layer 3 as well is triaxially strained and has increased hole mobility and electron mobility.

With reference to the figures, the production of a monoclinically distorted Si layer 3 by use of the method according to the invention is described for a further illustrated embodiment.

A heterostructure comprising a substrate 1, a 175-nm thick pseudomorphous $Si_{0.77}Ge_{0.23}$ layer 2, and a 7-nm thick Si surface layer 3 of Si (100) were used as starting materials.

For subsequent ion implantation a protective layer was deposited on the heterostructure. This protective layer was composed of $SiO_2$ deposited by PECVD. The heterostructure was implanted with 60 keV $He^+$ ions at a dosage of $7\times10^{15}$ $cm^{-2}$ and was subsequently tempered at 450° C. for 1 min. The protective layer was removed by wet chemical etching in buffered HF solution. According to the principle shown for FIG. 5, lines having a width of 4 μm and a length of 8 millimeters (not 10 μm as illustrated in FIG. 5) were structured using standard lithography and reactive ion etching. The structure was then tempered at 850° C. for 10 min in an Ar atmosphere.

RBS/channeling measurements showed that the Si—Ge lines in the <110> longitudinal direction had a relaxation of only 42%, whereas the lines transverse to the longitudinal direction had a relaxation of 72%.

This means, advantageously, that the lattice parameter in the longitudinal direction is smaller than the lattice parameter transverse to the longitudinal direction. The corresponding lattice distortion produced in the Si layer 3 was 0.41% along the lines, and 0.71% perpendicular to the lines.

According to a further illustrated embodiment, a 175-nm thick $Si_{0.77}Ge_{0.23}$ layer and an 8-nm thick cubic Si layer 3 were used as starting materials. Once again, a 100-nm thick PECVD oxide layer was applied to layer 3 of FIG. 5. The heterostructure was implanted with 60 keV $He^+$ ions at a dosage of $1\times10^{16}$ $cm^{-2}$ and was subsequently tempered at 600° C. for 1 min. A 10-nm thick Cr layer was deposited on the surface of the structure. This layered structure was structured using rectangular masks having a length×width of approximately 10×2 μm. The Cr layer was used as a hard mask to produce the rectangular structures 2, 3. The Cr layer and the protective layer were removed by wet chemical etching. The structure was then tempered at 850° C. for 10 min in an Ar atmosphere. No dislocations were detectable in the 2 to 10 μm structures, using transmission electron microscopy with a detection limit of approximately $10^5$ $cm^{-2}$.

According to a further illustrated embodiment, with reference to the figures a Si—Ge layer 2 may optionally be provided on a substrate 1, but with a thin Si cap layer. The advantage is that the Si cap layer is directly strained during relaxation of the Si—Ge layer. Thus, only a single epitaxial step is necessary to produce a strained Si layer 3 on a strained Si—Ge layer 2. The layer thickness $d_3$ of the Si layer 3 is advantageously selected such that its critical layer thickness is not exceeded.

As an alternative, a SOI substrate having a thin Si layer may be used for depositing the Si—Ge layer and optionally an additional Si layer. The Si layer on the oxide assumes the function of layer 3 in FIG. 5, and must therefore also have a subcritical layer thickness in order to be triaxially strained during relaxation of the structured Si—Ge layer. Triaxially strained Si 3 is then produced directly on a $SiO_2$ layer 2, without wafer bonding.

In a further embodiment of the invention a thin high-carbon Si—Ge—C layer may be incorporated into the layer 2. Carbon may be incorporated into silicon up to approximately 2 atom-% substitution to reduce the lattice parameter.

In this manner, thin relaxed Si—Ge layers are produced by incorporating a very thin, 10 nanometers, for example, Si—C layer having a sufficiently high carbon content into a: Si—Ge layer (for example, 170 nanometer Si—Ge, 22 atom-%). During the tempering at high temperatures of approximately 900° C., the carbon present in an oversaturated state precipitates. Defects are thus formed that facilitate the relaxation of a Si—Ge layer. In this manner ion MM? implantation is advantageously replaced by a specialized layered structure.

A higher degree of relaxation of this Si—Ge layer may be achieved by further implantation, thereby increasing the strain in the Si layer 3.

The invention claimed is:

1. A method for producing a triaxially strained layer, comprising the following steps:
    placing the layer on a substrate and biaxially straining it by lattice mismatch,
    structuring the biaxially strained layer,
    relaxing the biaxially strained layer by formation of crystal defects and heat treatment, and
    providing directional dislocations in the biaxially strained layer with different densities as a function of the geometry with respect to the glide directions of the dislocations and the extension of the structure on the substrate, as well as the crystal orientation of the substrate.

2. The method according to claim 1 wherein the structure formed in the triaxially strained layer has a length-to-width ratio greater than two.

3. The method according to claim 1, further comprising the step of
    selecting Si—Ge or Si—Ge—C or a Si—Ge layer having a thin Si cap layer as the material for the triaxially strained layer.

4. The method according to claim 1, comprising the step of
    selecting Si or a SOI substrate as the material for the substrate.

5. The method according to claim 1, further comprising the step of
    implanting at least one ion in the triaxially strained layer.

6. The method according to claim 5, further comprising the step of
    selecting He, H, F, or Si ions for ion implantation.

7. The method according to claim 1, further comprising the step of
    performing at least one heat treatment.

8. The method according to claim 1 wherein a monoclinic or triclinic system is formed from a cubic system in the triaxially strained layer.

9. The method according to claim 1 further comprising the step of
    providing an additional layer on the triaxially strained layer.

10. The method according to claim 9 wherein the additional layer is triaxially strained.

11. The method according to claim 9, further comprising the step of
    selecting silicon as the material for the additional layer.

12. A triaxially strained layer on a substrate produced according to the method of claim 1.

13. The triaxially strained layer on a substrate according to claim 12 wherein the triaxially strained layer comprises Si—Ge.

14. The triaxially strained layer on a substrate according to claim 12 wherein an additional layer that is triaxially strained is provided on the triaxially strained layer.

15. The triaxially strained layer on a substrate according to claim 14 wherein the additional layer and/or the substrate comprises Si.

16. The triaxially strained layer on a substrate according to claim 12 wherein the substrate is SOI.

17. An electronic component comprising a triaxially strained layer on a substrate according to claim 12.

* * * * *